United States Patent
Luyken et al.

(10) Patent No.: US 7,605,032 B2
(45) Date of Patent: Oct. 20, 2009

(54) METHOD FOR PRODUCING A TRENCH TRANSISTOR AND TRENCH TRANSISTOR

(75) Inventors: Richard Johannes Luyken, Munich (DE); Hans-Peter Moll, Dresden (DE); Martin Popp, Dresden (DE); Till Schloesser, Dresden (DE); Marc Strasser, Munich (DE); Rolf Weis, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/529,446

(22) Filed: Sep. 28, 2006

(65) Prior Publication Data
US 2007/0075361 A1   Apr. 5, 2007

(30) Foreign Application Priority Data
Sep. 30, 2005   (DE) .................. 10 2005 047 058

(51) Int. Cl.
*H01L 21/334* (2006.01)
*H01L 21/8234* (2006.01)
*H01L 27/108* (2006.01)
*H01L 29/94* (2006.01)
*H01L 21/336* (2006.01)
*H01L 27/088* (2006.01)

(52) U.S. Cl. .................. 438/197; 257/300; 257/401; 438/270

(58) Field of Classification Search ............... 257/390, 257/330, 300; 438/270, 259, 242, 197
See application file for complete search history.

(56) References Cited

U.S. PATENT DOCUMENTS

| 5,821,591 | A  | * | 10/1998 | Krautschneider et al. ... 257/390 |
| 6,844,591 | B1 | * | 1/2005  | Tran .......................... 257/330 |
| 2003/0119264 | A1 | | 6/2003 | Park |

OTHER PUBLICATIONS

German Office Action dated Jul. 4, 2006.

\* cited by examiner

*Primary Examiner*—Davienne Monbleau
*Assistant Examiner*—Monica D Harrison
(74) *Attorney, Agent, or Firm*—Fay Kaplun & Marcin, LLP

(57) ABSTRACT

In a method for producing a trench transistor, a substrate of a first conduction type is provided and a trench in the substrate and a gate dielectric in the trench are formed. A first conductive filling in the trench as a gate electrode on the gate dielectric and first source and drain regions are formed. An etched-back first conductive filling is produced by etching back the first conductive filling down to a depth below the first source and drain regions and second source and drain regions are formed. The second source and drain regions adjoin the first source and drain regions and extend to a depth at least as far as the etched-back first conductive filling. An insulation spacer above the etched-back first conductive filling is formed in the trench and a second conductive filling is provided in the trench as an upper part of the gate electrode.

19 Claims, 12 Drawing Sheets

METHOD FOR PRODUCING A TRENCH TRANSISTOR AND TRENCH TRANSISTOR

BACKGROUND OF THE INVENTION

The present invention relates to a method for producing a trench transistor and to a trench transistor.

Although applicable in principle to arbitrary integrated circuits, the present invention and also the problems on which it is based will be explained with regard to integrated memory circuits in silicon technology.

Published U.S. application for patent No. 2005/0042833 A1 discloses a method for fabricating an integrated circuit device comprising a trench transistor. The conventional method has the following steps of: defining an active region by forming a trench device isolation region on an integrated circuit substrate; forming a mask pattern on the integrated circuit substrate that uncovers a channel sub-region of the active region and the trench device isolation region alongside the channel sub-region; etching the trench device isolation region that is uncovered by the mask pattern in order to form a depression as far as a first depth using the first mask pattern as an etching mask; etching the channel sub-region in order to form a gate trench having a second depth, which is deeper than the first depth, using the mask pattern as an etching mask, and forming a recessed gate that fills the gate trench.

Problems in trench transistors of this type are caused by the overlap between the vertical gate and the highly doped source/drain regions. Said overlap causes high electric fields, which cause leakage currents in the switched-off state of the transistor. Moreover, depth or recess fluctuations have a great effect on the current in the switched-on state, since the transistor connection becomes poor if the source/drain doping regions no longer extend below the gate.

BRIEF SUMMARY OF THE INVENTION

The invention provides a method for producing a trench transistor, comprising the steps of:
providing a semiconductor substrate of a first conduction type;
forming a trench in the substrate;
forming a gate dielectric on the substrate in the trench;
providing a first conductive filling in the trench as gate electrode on the gate dielectric;
forming first source and drain regions by introducing impurities of a second conduction type into the surface of the substrate alongside the trench;
etching back the first conductive filling in the trench down to a depth below the first source and drain regions;
forming second source and drain regions by introducing impurities of a second conduction type into the surface of the substrate in the trench, the second source and drain regions adjoining the first source and drain regions and extending to a depth at least as far as the etched-back first conductive filling;
forming an insulation spacer above the etched-back first conductive filling in the trench; and
providing a second conductive filling in the trench as upper part of the gate electrode, which is in electrical contact with the etched-back first conductive filling and is electrically insulated from the first and second source and drain regions by the insulation spacer.

The present invention preferably uses a self-aligned implantation for providing source/drain doping regions of the trench geometry affected by tolerances.

The formation of second source and drain regions may be effected by an implantation step, the etched-back first conductive filling serving as a mask. This provides for a self-aligned arrangement.

In one embodiment of the inventive method, a doped insulation spacer is formed and the formation of second source and drain regions is effected by a diffusion step, the dopant being outdiffused from the doped insulation spacer into the semiconductor substrate. This likewise provides for a self-aligned arrangement.

An implantation step may be effected prior to providing the first conductive filling in the trench, implantation of impurities of the first conduction type resulting in the formation of a doping region lying below the bottom of the trench and having locally increased doping in the semiconductor substrate. This makes it possible to prevent undesired punch-throughs.

An implantation step may be effected after providing the first conductive filling in the trench, implantation of impurities of the first conduction type using a mask resulting in the formation of a doping region lying alongside the trench and having locally increased doping in the semiconductor substrate. This likewise makes it possible to prevent undesired punch-throughs.

In one embodiment of the inventive method, an implantation step is effected after the formation of the insulation spacer, implantation of impurities of the first conduction type into the first source and drain regions using the insulation spacer as a mask resulting in the formation of a counterdoping region adjoining the insulation spacer in the first source and drain regions. This makes it possible to prevent undesired field strength spikes at these locations.

A formation region of the trench transistor may be surrounded by isolation trenches filled with an insulation material.

Preferred embodiments of the invention are illustrated in the drawings and are explained in the description below.

DETAILED DESCRIPTION OF THE INVENTION

In the figures, identical reference symbols designate identical or functionally equivalent components.

Figure 1:
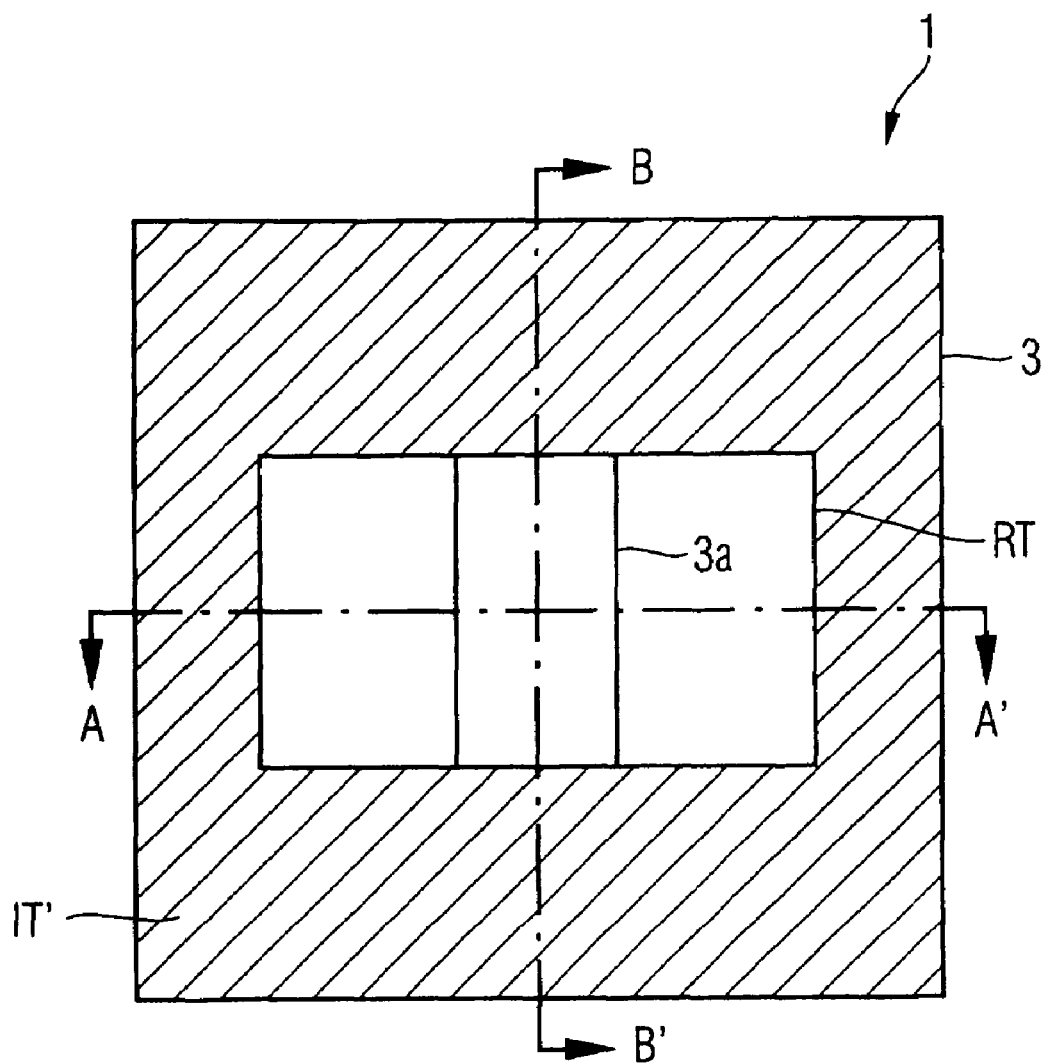
FIG. 1 is a schematic planar view of the geometrical arrangement of a first exemplary embodiment of a trench transistor.
Figure 1A:
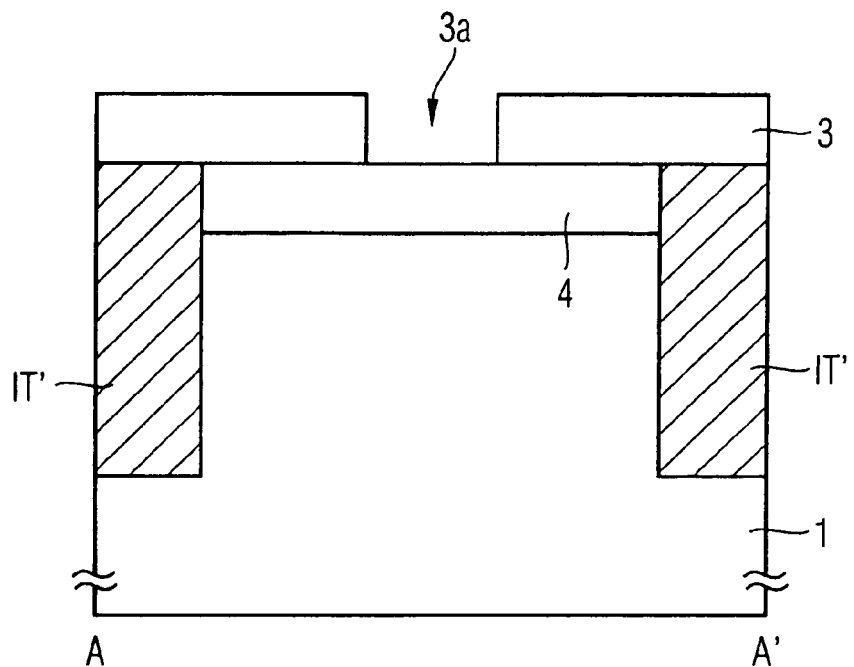
FIGS. 1A,B-7A,B respectively, are two different schematic cross sections along the lines A-A' and B-B' from FIG. 1 illustrating an exemplary embodiment of a method for producing a trench transistor and a corresponding trench transistor.
Figure 1B:
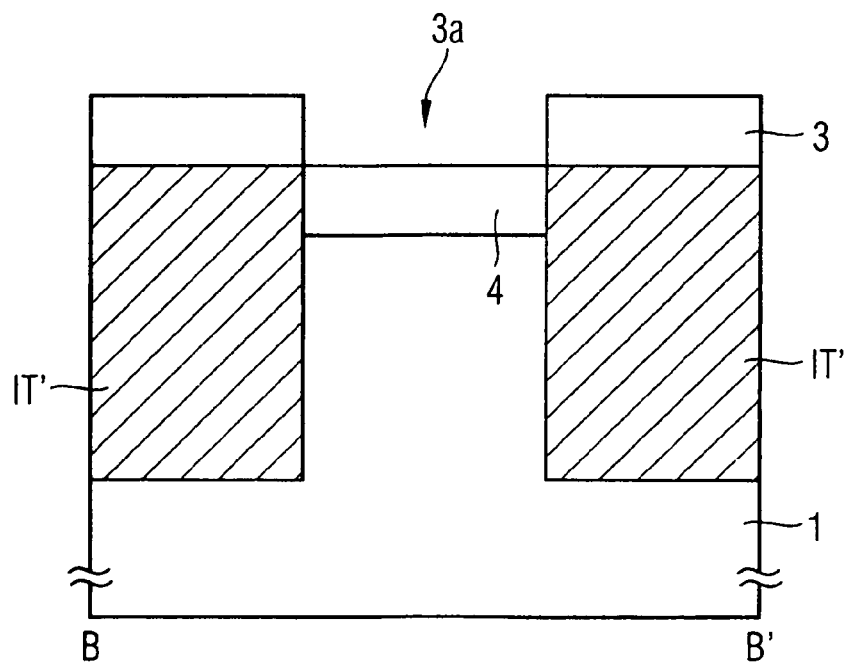

FIG. 1 shows a schematic planar view of the geometrical arrangement of a trench transistor as first embodiment of the present invention, and FIGS. 1A,B show two different schematic cross sections along the lines A-A' and B-B', respectively, from FIG. 1.

In FIG. 1, reference symbol 1 designates a semiconductor substrate with a nitride sacrificial layer 3 on its surface and with isolation trenches IT' alongside a formation region RT for the trench transistor, the isolation trenches IT' being filled with $SiO_2$ as insulation material extending as far as the upper surface of the substrate 1. In particular, such an arrangement can be obtained by means of a CMP process (CMP=Chemical Mechanical Polishing). Referring further to FIGS. 1A,B, source/drain regions 4 are formed in the surface of the semiconductor substrate 1 e.g. by means of an implantation step.

An opening 3a of the mask layer is then formed in the mask layer 3, which extends in the direction B-B' and uncovers the substrate 1 in the central region of the formation region RT. The opening 3a defines the position of a trench 5 that is to be etched in the substrate 1 in the subsequent step.

FIGS. 1A,B to 7A,B show the two different schematic cross sections along the lines A-A' and B-B', respectively, from FIG. 1 of a fabrication method for a trench transistor and a corresponding trench transistor as first embodiment of the present invention, which proceeds from FIGS. 1A,B.

Figure 2A:
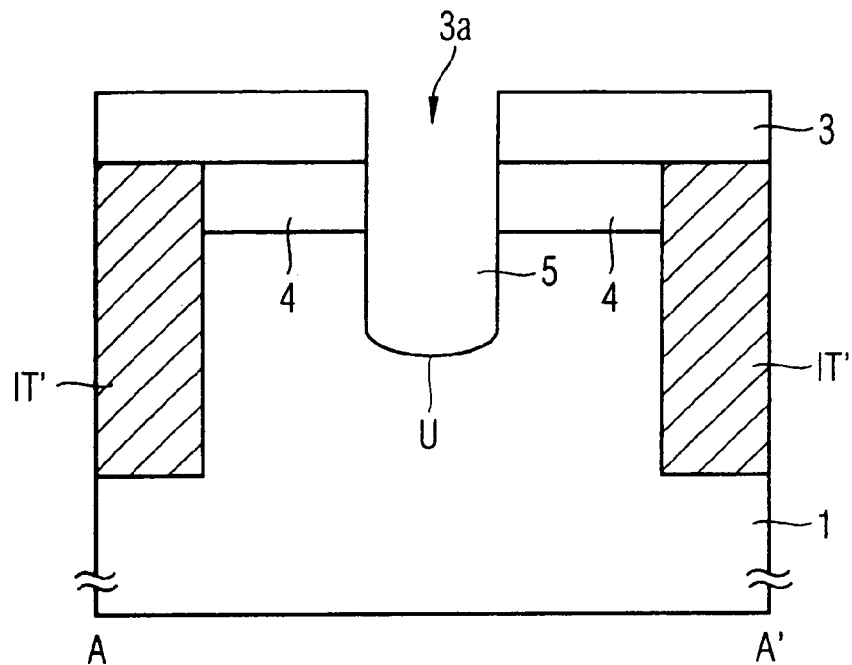
Figure 2B:
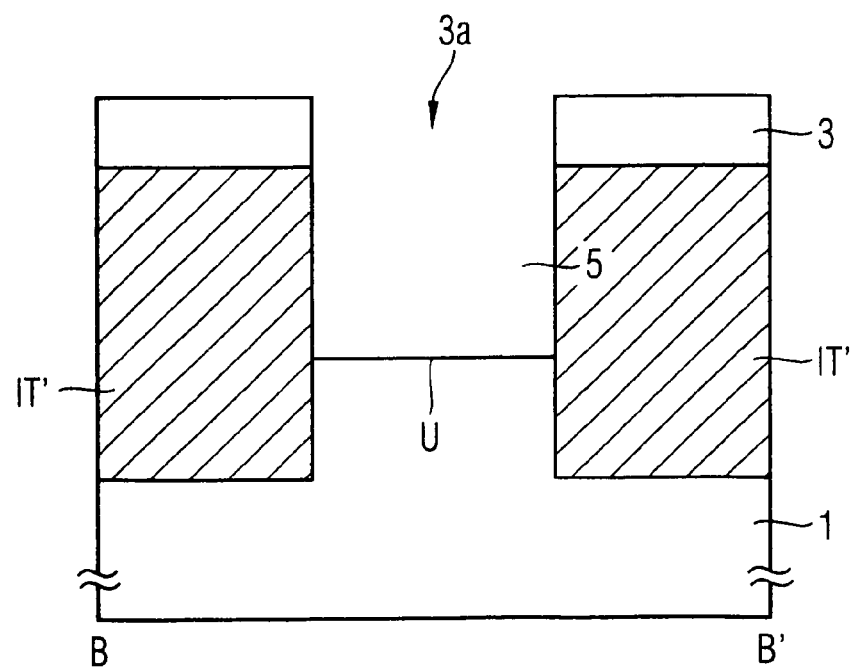

In the subsequent process step, illustrated in FIGS. 2A,B, the trench 5 of the trench transistor is formed by means of a dry etching process. Reference symbol U designates the bottom of the trench 5. The dry etching process is a selective etching process that etches the silicon with high selectivity with respect to the mask layer 3, which functions as a hard mask in this step.

Figure 3A:
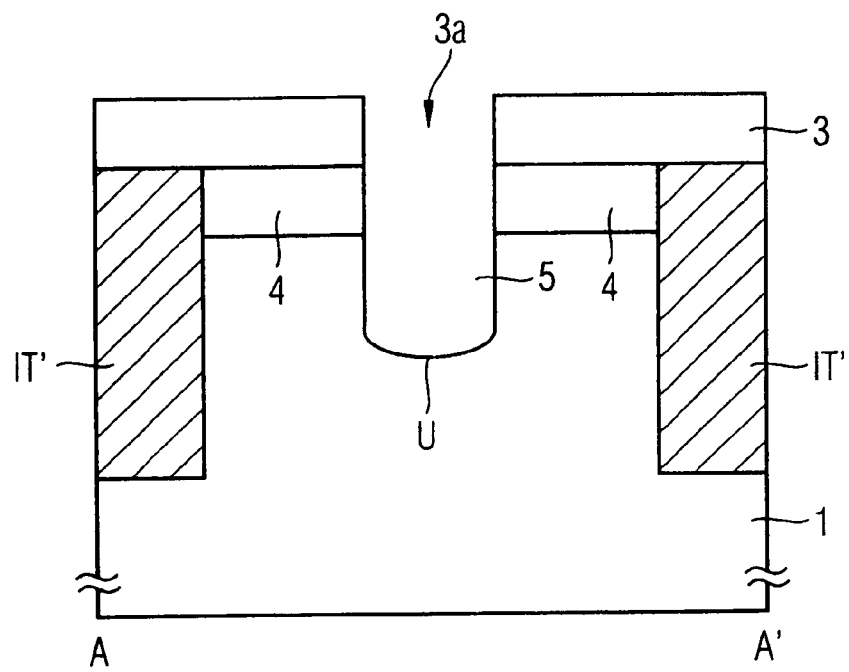
Figure 3B:
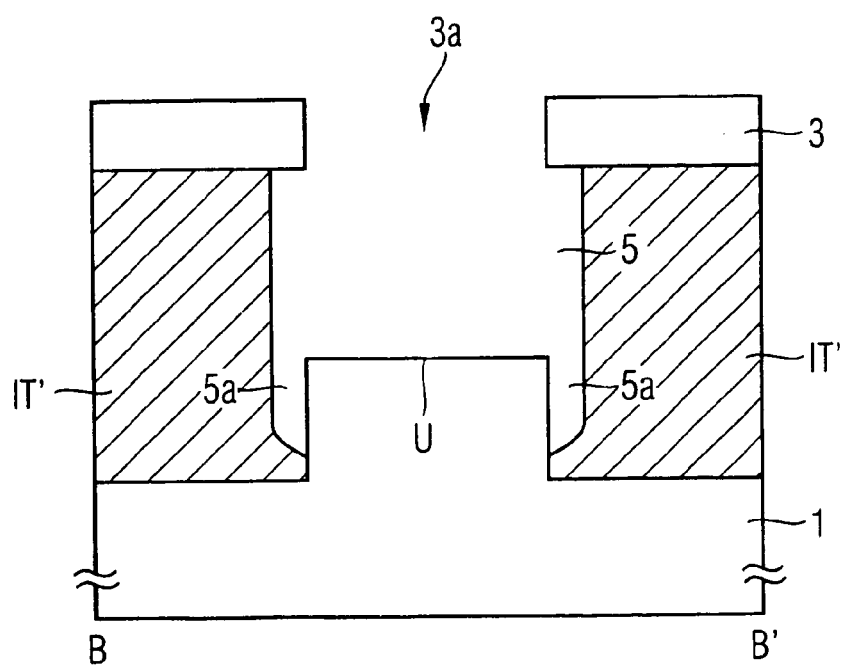

In the next process step, illustrated in FIGS. 3A,B, a wet etch is carried out in order to remove a part of the silicon oxide of the isolation trenches IT' alongside the trench 5 in the direction B-B', as can clearly be seen from FIG. 3B. This wet-etching step etches the silicon oxide with high selectivity with respect to the silicon of the silicon substrate 1. In this wet-etching step, the trench 5 is formed in the direction B-B', and undercut regions 5a are created along the direction B-B', which lie below the bottom U of the trench 5 and which lie alongside the trench 5. Provision of said undercut regions 5a improves the control of the gate above the channel region by the trigate arrangement since the gate can be extended to below the edges at the bottom U.

Figure 4A:
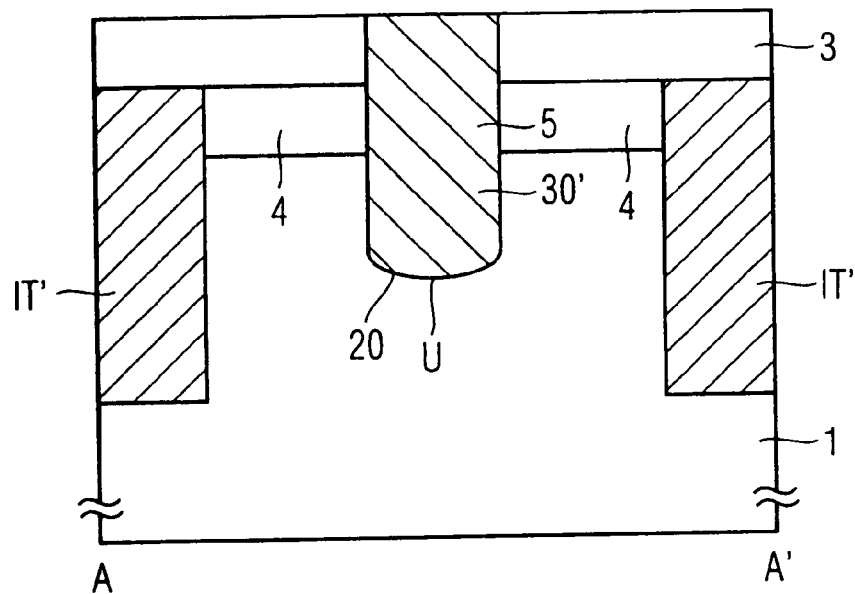
Figure 4B:
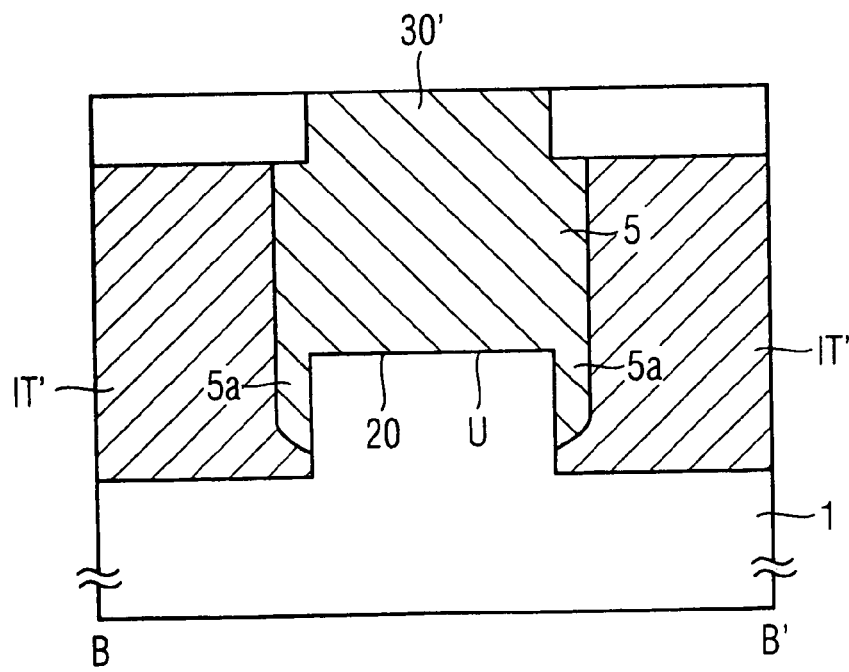

Afterwards, as shown in FIGS. 4A,B, the gate dielectric 20 made of silicon dioxide is formed on the substrate 1 in the trench 5. The trench 5 and the adjacent undercut regions 5a in the isolation trenches IT' are then filled with the gate electrode 30' made of a conductive polysilicon filling, to be precise preferably in a deposition step and a subsequent CMP process step, the mask layer 3 serving as a polishing stop. The gate electrode 30' made of polysilicon then extends as far as the surface of the mask layer 3.

Figure 5A:
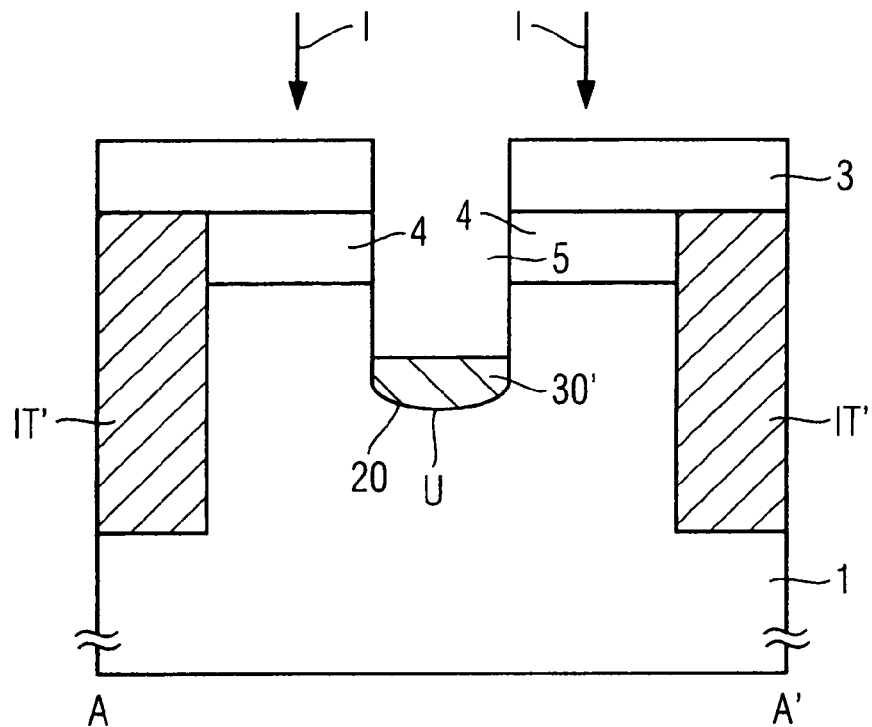
Figure 5B:
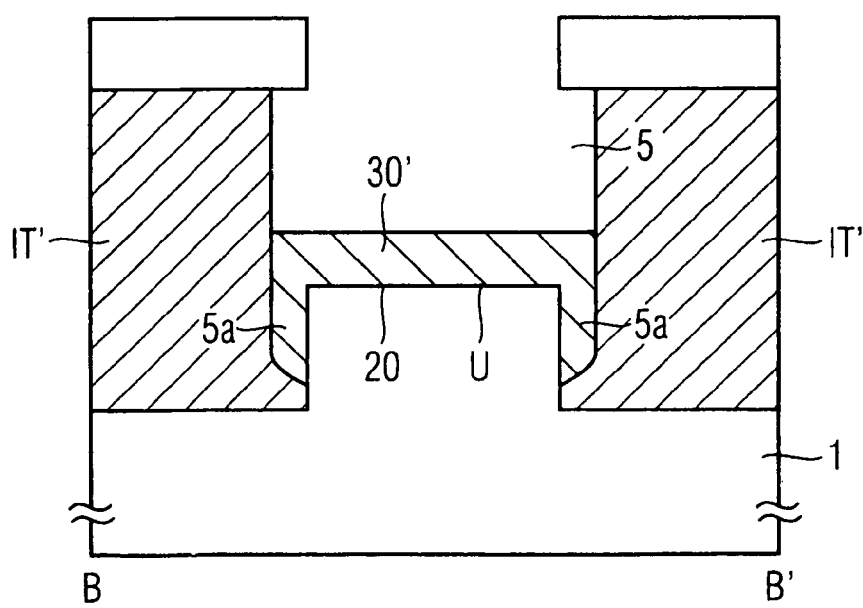

As illustrated in FIGS. 5A,B, this is then followed by etching back the gate electrode 30' within the trench 5 to below the depth of the source/drain regions 4 using the mask layer 3 as a mask.

Figure 6A:
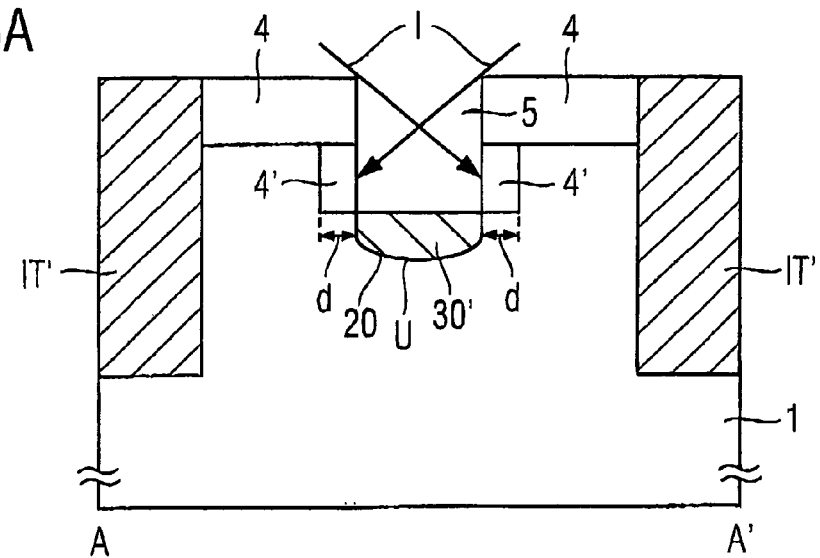
FIG. 6C is a modification of the first exemplary embodiment of the trench transistor.
Figure 6B:
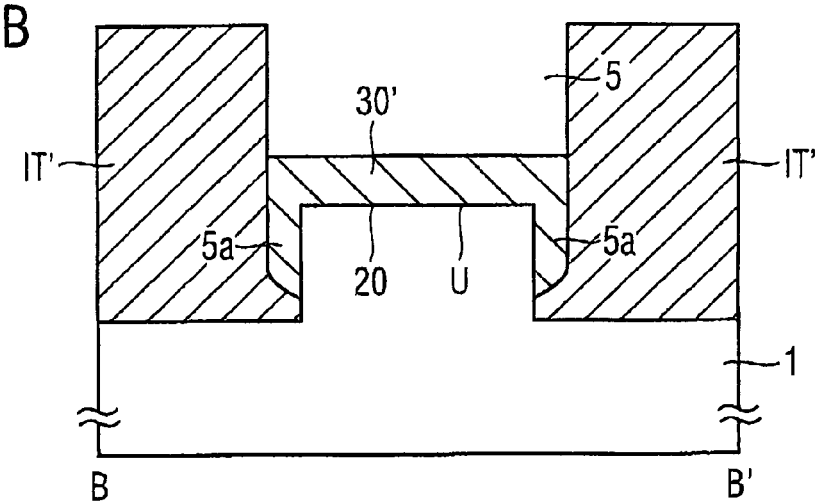

Referring to FIGS. 6A,B, the mask layer 3 is removed. A subsequent process step involves providing lightly doped source/drain regions 4' (LDD) in the semiconductor substrate 1 at the walls of the trench above the etched-back gate electrode 30'. This implantation I is likewise self-aligned and provides for a good connection of the channel region below the gate electrode 30' to the source/drain regions 4, 4'. The lightly doped source/drain regions 4' (LDD) in the semiconductor substrate 1, proceeding from the trench wall, have a smaller lateral extent d than the source/drain regions 4. This enables good conducting of the current flow in the vicinity of the gate, a controlled potential reduction path and a good blocking behaviour.

Figure 7A:
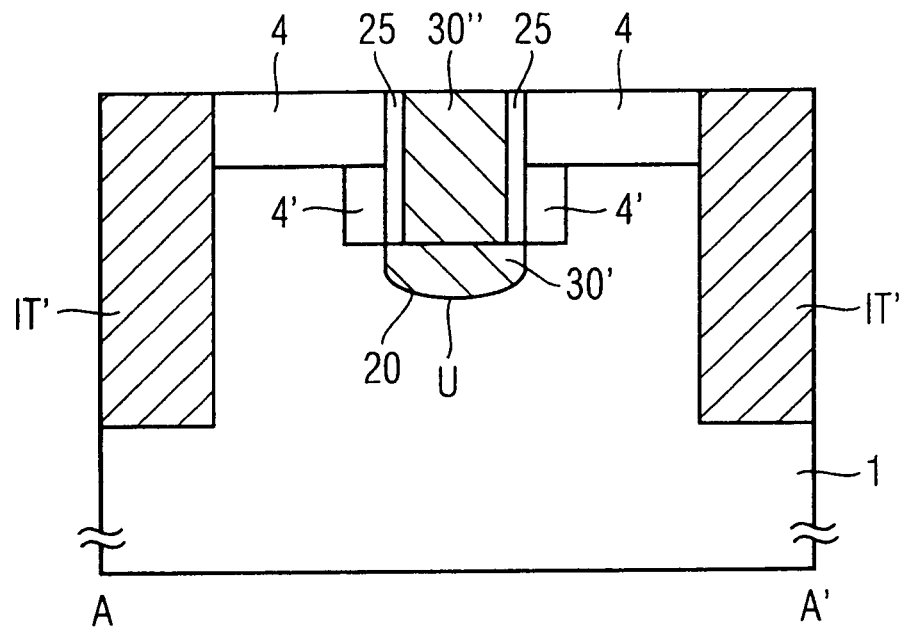
Figure 7B:
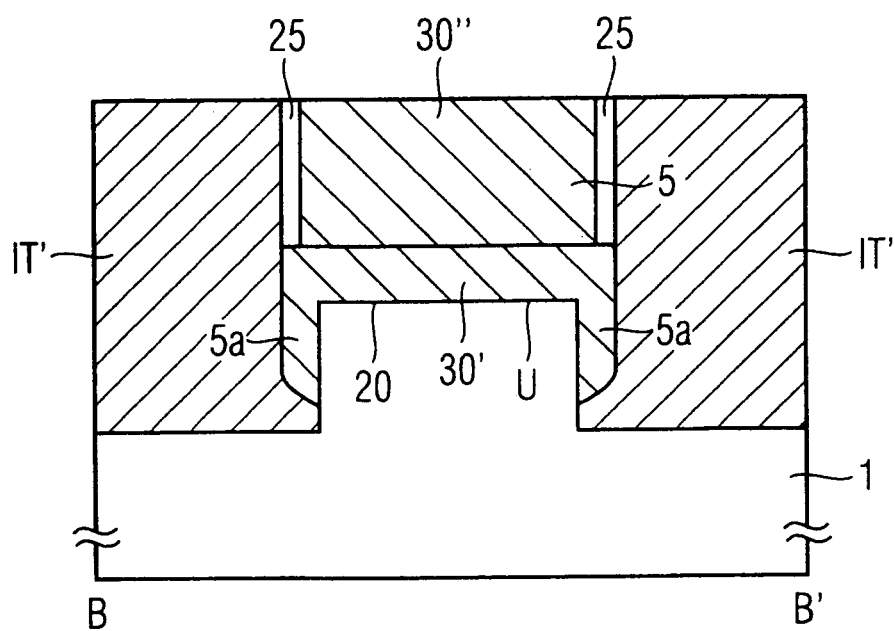

In a subsequent process step, illustrated in FIGS. 7A,B, an insulation spacer 25 made of silicon oxide is then formed at the trench walls above the etched-back gate electrode 30'. This is followed by depositing and polishing back a conductive polysilicon layer 30" for forming an upper region of the gate electrode.

The trench transistor in accordance with the first embodiment is thus completed. In further process steps (not illustrated), the source/drain regions 4 and the gate electrode 30', 30" are then connected to further circuit components (not illustrated here).

Figure 6C:
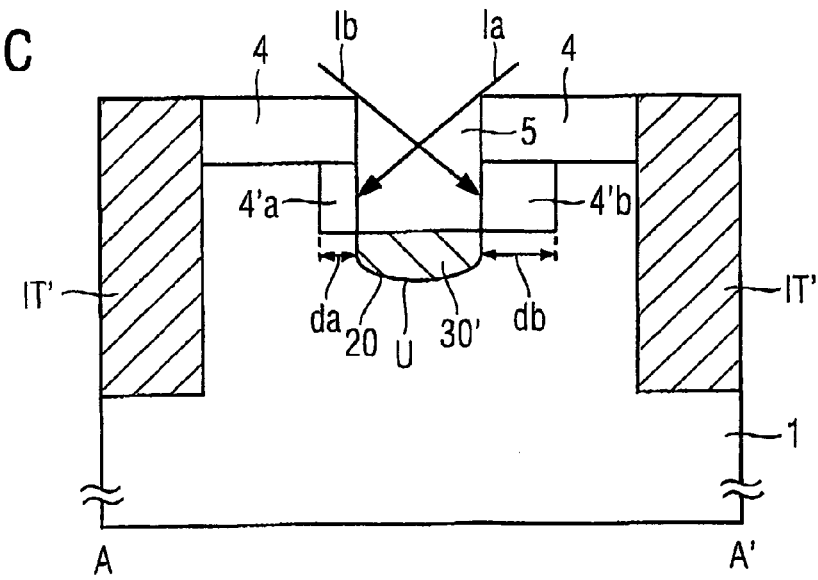

FIG. 6C shows a modification of the first embodiment of the present invention. In this modification, the lightly doped source/drain regions 4'a, 4'b (LDD) in the semiconductor substrate 1 are asymmetrical, the lightly doped source/drain region 4'a (LDD) having a smaller lateral extent than the source/drain region 4'b. This is made possible by two implantations Ia, Ib with different penetration depths. It goes without saying that an asymmetry with regard to doping type and/or atoms may also be provided.

Figure 8A:
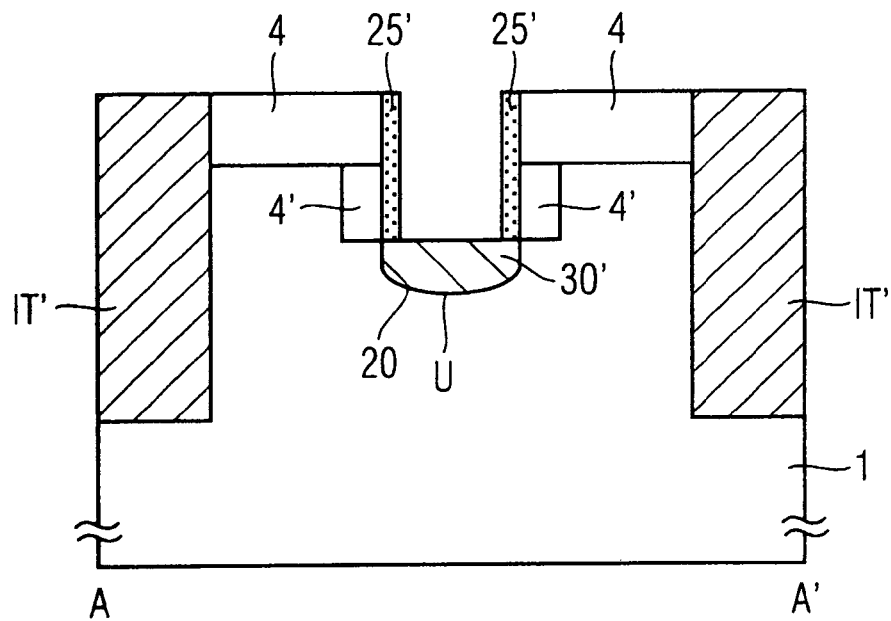
FIGS. 8A,B are two different schematic cross sections along the lines A-A' and B-B', respectively, from FIG. 1 illustrating a further exemplary embodiment of a method for producing a trench transistor and a corresponding trench transistor.
Figure 8B:
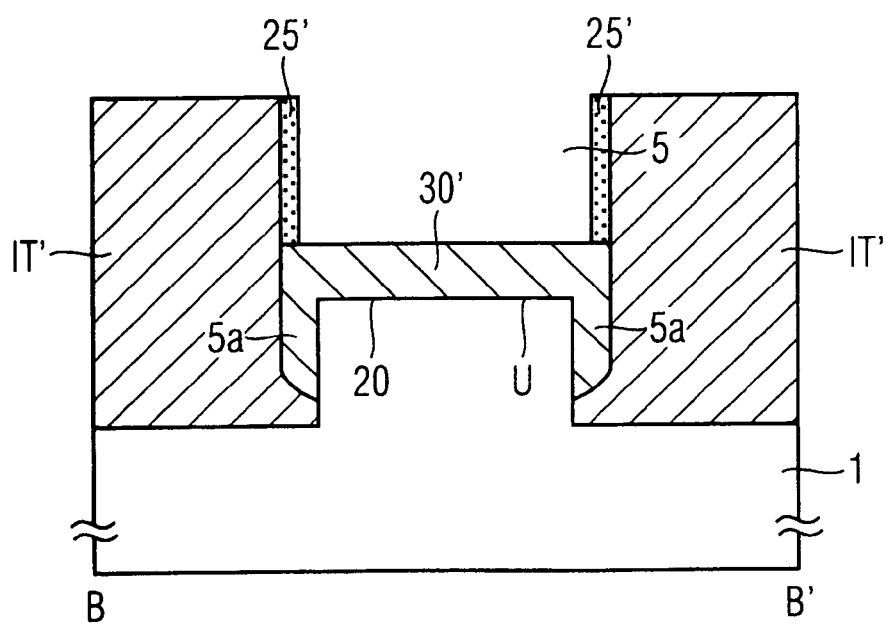

FIGS. 8A,B are two different schematic cross sections along the lines A-A' and B-B', respectively, from FIG. 1 of a production method for a trench transistor and a corresponding trench transistor as second embodiment of the present invention.

In the second embodiment in accordance with FIGS. 8A,B, the doping of the source/drain regions 4' is not effected by means of an oblique implantation, but rather by the provision of a doped silicon oxide spacer 25' and a subsequent outdiffusion from the doped silicon oxide spacer 25'.

Figure 9A:
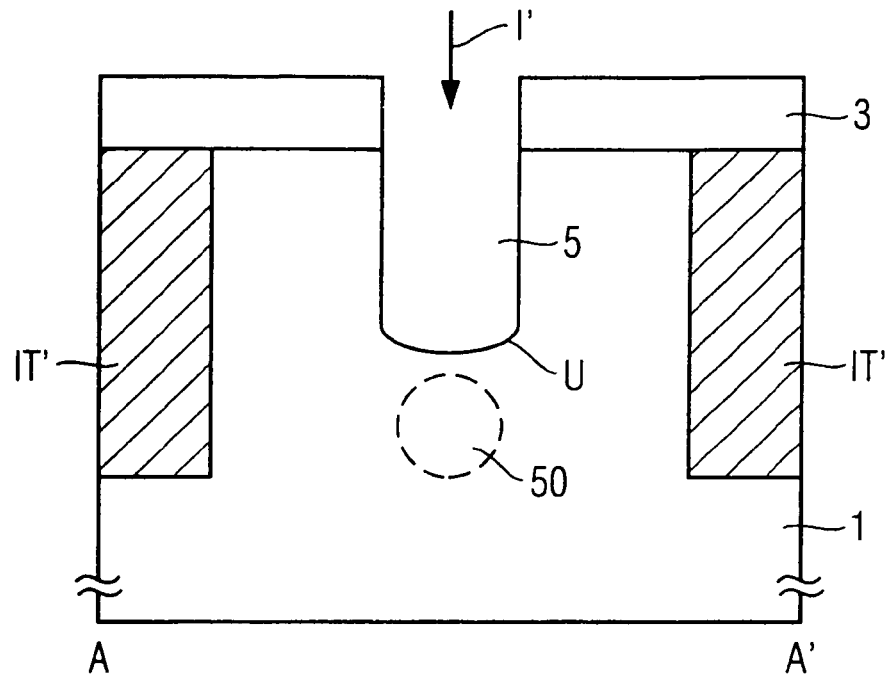
FIGS. 9A,B are two different schematic cross sections along the lines A-A' and B-B', respectively, from FIG. 1 illustrating another exemplary embodiment of a method for producing a trench transistor and a corresponding trench transistor.
Figure 9B:
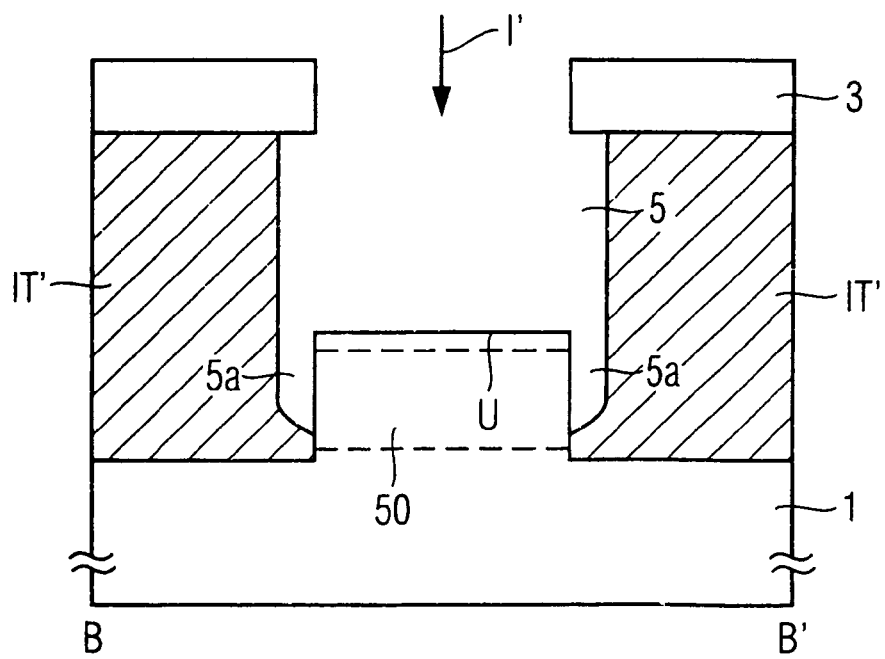

FIGS. 9A,B are two different schematic cross sections along the lines A-A' and B-B', respectively, from FIG. 1 of a production method for a trench transistor and a corresponding trench transistor as third embodiment of the present invention.

In the third embodiment in accordance with FIGS. 9A,B, an implantation I' for forming a doping region 50 below the bottom U of the trench 5 as anti-punch-through region is effected prior to or after forming the gate dielectric and prior to forming the gate electrode in the trench 5. Deeply located punch-through paths can thus be suppressed. This implantation creates a channel doping that is independent of the depth of the trench 5 and may, of course, also be carried out obliquely in order to achieve a greater distance with respect to the node side in the case of use in a DRAM semiconductor memory circuit.

Figure 10A:
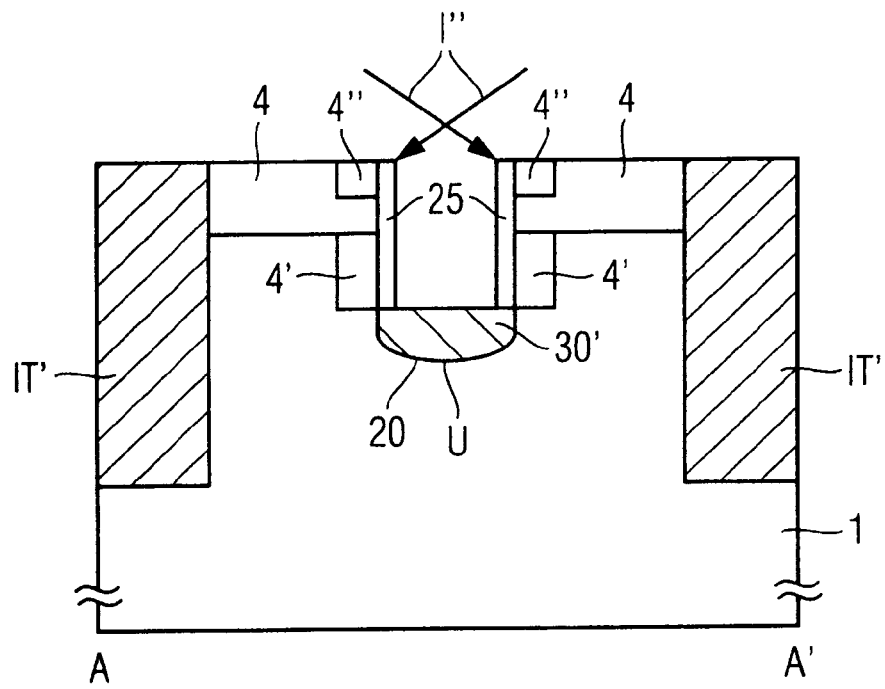
FIGS. 10A,B are two different schematic cross sections along the lines A-A' and B-B', respectively, from FIG. 1 illustrating a further exemplary embodiment of a method for producing a trench transistor.
Figure 10B:
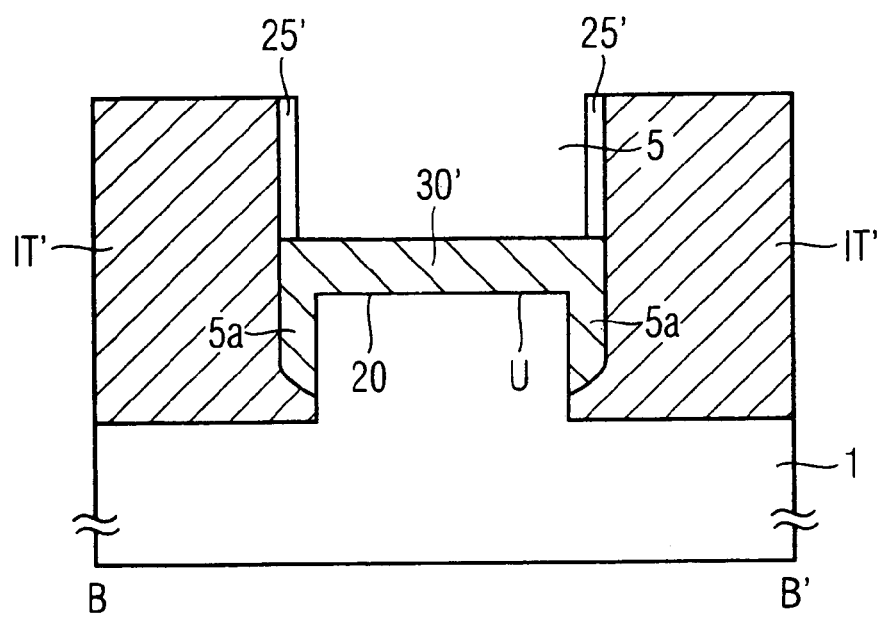

FIGS. 10A,B are two different schematic cross sections along the lines A-A' and B-B', respectively, from FIG. 1 of a production method for a trench transistor and a corresponding trench transistor as fourth embodiment of the present invention.

In the fourth embodiment of the present invention in FIGS. 10A,B, a very shallow oblique implantation I" is carried out in order to form superficially weakly counterdoped source/drain regions 4'', that is to say that a lateral doping gradient of the source/drain regions 4 is created in order to attenuate the high electric fields that arise there. This implantation I'' is expediently effected after forming the inner insulation spacer 25 using the latter as a mask. This embodiment may be combined either with the first embodiment or with the second embodiment.

Figure 11A:
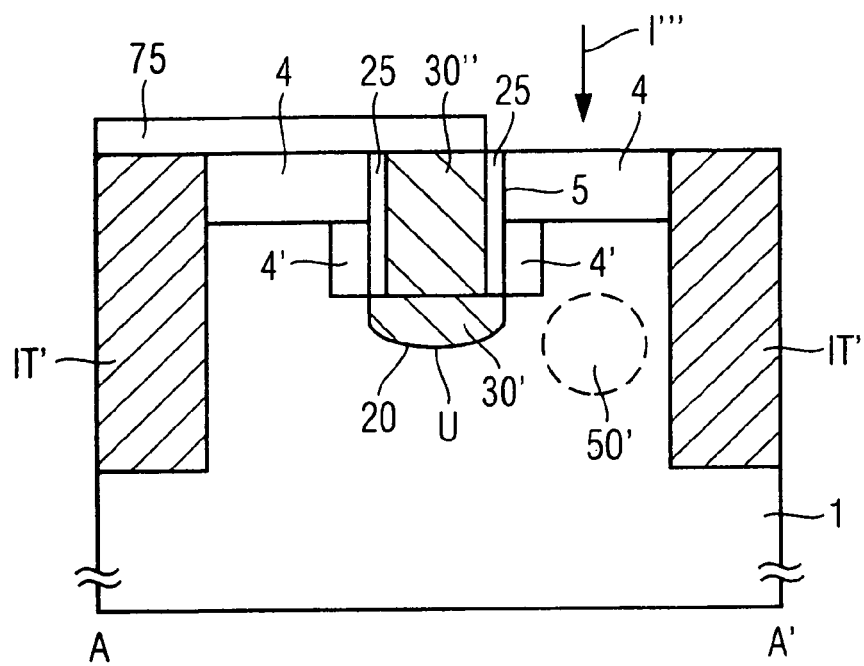
FIGS. 11A,B are two different schematic cross sections along the lines A-A' and B-B', respectively, from FIG. 1 illustrating another exemplary embodiment of a method for producing a trench transistor and a corresponding trench transistor.
Figure 11B:
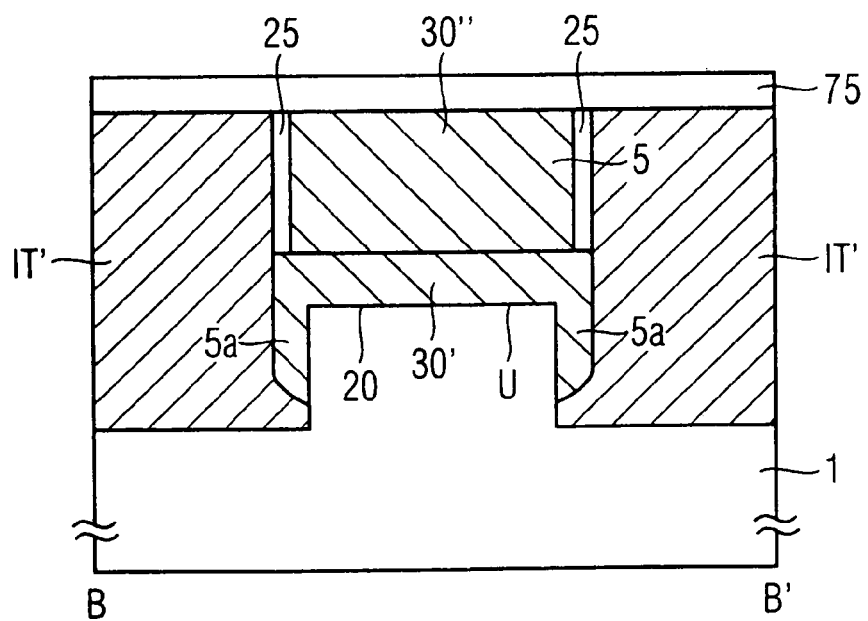

FIGS. 11A,B are two different schematic cross sections along the lines A-A' and B-B', respectively, from FIG. 1 of a production method for a trench transistor and a corresponding trench transistor as fifth embodiment of the present invention.

In the fifth embodiment shown in FIGS. 11A,B, after the trench 5 has been filled with the upper part 30'' of the gate electrode made of polysilicon, a photoresist mask 75 is applied, after which an implantation I''' is effected in order to produce an asymmetrically located doping region 50' in the semiconductor substrate 1, which functions as an anti-punch-through region.

Although the present invention has been described with regard to preferred embodiments, it is not restricted thereto, but rather can be modified in various ways which appear clear to the person skilled in the art.

In particular, the selection of the materials is only an example and can be varied diversely.

In the embodiments shown here, both sides of the trench transistor are doped to the same extent with regard to the source/drain regions 4'. However, this is not absolutely necessary; rather, the two sides may be doped with different doping levels in the case of use in a memory circuit, so that bit line sides and node sides have dopings with different magnitudes.

It goes without saying that the invention can be applied to both stacked and trench DRAM semiconductor memory circuits.

What is claimed is:

1. A method for forming an integrated circuit comprising a transistor, the method comprising:
   forming a trench in a semiconductor substrate of a first conduction type;
   forming a gate dielectric on the substrate in the trench;
   forming a first conductive filling in the trench as a gate electrode on the gate dielectric;
   removing a portion of the first conductive filling in the french down to a depth below the substrate surface;
   forming doped regions by introducing impurities of a second conduction type into the surface of the substrate in the trench; the doped regions extending to a depth at least as far as a surface of the first conductive filling;
   forming an insulation spacer above the first conductive filling in the trench; and
   forming a second conductive filling in the trench as an upper part of the gate electrode; the second conductive filling being in electrical contact with the first conductive filling and being electrically insulated from the doped regions by the insulation spacer.

2. The method of claim 1, wherein forming the insulation spacer comprises forming a doped insulation spacer; the step of forming the doped regions being effected by a diffusion step comprising outdiffusing the dopant from the doped insulation spacer into the semiconductor substrate.

3. The method of claim 1, comprising, prior to providing the first conductive filling in the trench, an implantation step that comprises implanting impurities of the first conduction type resulting in forming of a doping region lying below the bottom of the trench and comprising locally increased doping in the semiconductor substrate.

4. The method of claim 1, comprising, after providing the first conductive filling, an implantation step in the trench that comprises implanting impurities of the first conduction type utilizing a mask resulting in forming a doping region lying alongside the trench and comprising locally increased doping in the semiconductor substrate.

5. The method of claim 1, wherein a formation region of the trench transistor is surrounded by isolation trenches filled with an insulation material.

6. An integrated circuit including a transistor comprising:
   a trench in a semiconductor substrate of a first conduction type; the trench being filled with a conductive filling, the conductive filling being insulated from the substrate by a gate dielectric;
   first source and drain regions in the surface of the substrate alongside the trench;
   second source and drain regions in the substrate; the second source and drain regions being disposed below the first source and drain regions, respectively, and, proceeding from the trench, having a smaller lateral extent than the first source and drain regions;
   an insulation spacer being disposed in an upper portion of the trench, the insulation spacer having a larger thickness than the gate dielectric.

7. The integrated circuit of claim 6, comprising a doping region in the semiconductor substrate; the doping region lying below the trench and comprising locally increased doping of the first conduction type.

8. The integrated circuit of claim 6, comprising a doping region in the semiconductor substrate; the doping region lying alongside the trench and comprising locally increased doping of the first conduction type.

9. The integrated circuit of claim 6, comprising a counter-doping region formed in the first source and drain regions and adjoining the insulation spacer.

10. The integrated circuit of claim 6, wherein the second source and drain regions are formed asymmetrically.

11. The method of claim 1, wherein the spacer is formed so as to have a larger thickness than the gate dielectric.

12. The method of claim 1, wherein forming the doped regions is effected by an angled implantation step, the first conductive filling serving as a mask.

13. The method of claim 1, further comprising forming first source and drain regions of the second conduction type.

14. The method of claim 13, comprising, after forming the insulation spacer, an implantation step that comprises implanting impurities of the first conduction type into the first source and drain regions utilizing the insulation spacer as a mask resulting in forming a counter doping region adjoining the insulation spacer in the first source and drain regions.

15. An integrated circuit including a transistor comprising:
   a trench in a semiconductor substrate of a first conduction type;
   first source and drain regions in the surface of the substrate alongside the trench;
   a first conductive filling in the trench as a gate electrode the first conductive filling being insulated from the semiconductor substrate by a gate dielectric; the first conductive filling being disposed in a lower portion of the trench below the first source and drain regions;
   second source and drain regions in the substrate; the second source and drain regions being disposed below the first source and drain regions and, proceeding from the trench, having a smaller lateral extent than the first source and drain regions;

an insulation spacer above the first conductive filling in the trench the insulation spacer having a larger thickness than the gate dielectric; and a second conductive filling an upper portion of the trench; the second conductive filling being in electric contact with the first conductive filling and being electrically insulated from the first and second source and drain regions by the insulation spacer.

16. The integrated circuit of claim 15, comprising a doping region in the semiconductor substrate; the doping region lying below the trench and comprising locally increased doping of the first conduction type.

17. The integrated circuit of claim 15, comprising a doping region in the semiconductor substrate; the doping region lying alongside the trench and comprising locally increased doping of the first conduction type.

18. The integrated circuit of claim 15, comprising a counterdoping region formed in the first source and drain regions and adjoining the insulation spacer.

19. The integrated circuit of claim 15, wherein the second source and drain regions are formed asymmetrically.

* * * * *